(12) United States Patent
Makarovic et al.

(10) Patent No.: US 7,477,772 B2
(45) Date of Patent: Jan. 13, 2009

(54) LITHOGRAPHIC APPARATUS AND DEVICE MANUFACTURING METHOD UTILIZING 2D RUN LENGTH ENCODING FOR IMAGE DATA COMPRESSION

(75) Inventors: Andrej Makarovic, Veldhoven (NL); Willem Jurrianus Venema, Eindhoven (NL); Lambertus Gerardus Maria Kessels, Aalst-Waaire (NL); Marcel Bontekoe, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 624 days.

(21) Appl. No.: 11/140,559

(22) Filed: May 31, 2005

(65) Prior Publication Data

US 2006/0269116 A1 Nov. 30, 2006

(51) Int. Cl.
*G06K 9/00* (2006.01)
*G06K 9/54* (2006.01)
(52) U.S. Cl. ...................... 382/141; 382/303
(58) Field of Classification Search ................ 382/141, 382/144, 232, 233, 303; 347/239; 355/67; 250/491.1
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,437,347 B1 * | 8/2002 | Hartley et al. ............ | 250/491.1 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,833,854 B1 * | 12/2004 | Sandstrom .................. | 347/239 |
| 7,164,465 B2 * | 1/2007 | Klosner et al. ................ | 355/67 |

(Continued)

FOREIGN PATENT DOCUMENTS

WO  WO 98/33096  7/1998

(Continued)

*Primary Examiner*—Kanji Patel
(74) *Attorney, Agent, or Firm*—Sterne, Kessler, Goldstein & Fox P.L.L.C.

(57) ABSTRACT

A lithographic apparatus comprises an array of individually controllable elements and a data processing pipeline. The array of individually controllable elements modulates a beam of radiation. The data processing pipeline converts a first representation of a requested dose pattern to a sequence of control data suitable for controlling the array of individually controllable elements in order substantially to form the requested dose pattern on a substrate. The data processing pipeline comprises an offline pre-processing device and an online rasterizer. The offline pre-processing device converts the first representation of the requested dose pattern to an intermediate representation, which can be rasterized in a fewer number of operations than the first representation. The storage device stores the intermediate representation. The online rasterizer accesses the stored intermediate representation and produces therefrom a stream of bitmap data to be used to generate the sequence of control data substantially in real time.

32 Claims, 15 Drawing Sheets

U.S. PATENT DOCUMENTS

| | | |
|---|---|---|
| 7,317,510 B2 * | 1/2008 | Bontekoe et al. .............. 355/67 |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO 98/38597 | 9/1998 |

* cited by examiner

LITHOGRAPHIC APPARATUS AND DEVICE MANUFACTURING METHOD UTILIZING 2D RUN LENGTH ENCODING FOR IMAGE DATA COMPRESSION

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate), e.g., via imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate can be rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

The device pattern and/or corresponding radiation dose pattern can be defined descriptively, for example in terms of vectors and/or groups of vectors (using hierarchy, for example). The GDSII (Graphical Design System II) format is in common use for defining flat panel displays, for example, and makes use of a vector-based description with hierarchy.

Such "high-level" descriptive representations, which typically comprise a certain degree of intrinsic compression, may need to be converted to bitmap data in order to generate a control signal suitable for a patterning array. In addition, the resulting control signal needs to be provided to the patterning array substantially in the order in which individual exposures are to be made, and at a suitable speed. This becomes difficult for complex device patterns due to the enormous size of the bitmap representations and the associated difficulties concerning storage, data conversion steps (to the bitmap data, for example) and/or transmission, for example.

Therefore, what is needed is a system and method to more effectively use pattern data.

SUMMARY

In one embodiment, there is provided a lithographic apparatus comprising an array of individually controllable elements and a data processing pipeline. The array of individually controllable elements modulates a beam of radiation. The data processing pipeline converts a first representation of a requested dose pattern to a sequence of control data suitable for controlling the array of individually controllable elements in order substantially to form the requested dose pattern on a substrate. The data processing pipeline comprises an offline pre-processing device and an online rasterizer. The offline pre-processing device converts the first representation of the requested dose pattern to an intermediate representation, which can be rasterized in a fewer number of operations than the first representation. The storage device stores the intermediate representation. The online rasterizer accesses the stored intermediate representation and produces therefrom a stream of bitmap data to be used to generate the sequence of control data substantially in real time.

According to one embodiment of the invention, there is provided a device manufacturing method comprising the following steps. Using an array of individually controllable elements to modulate a beam of radiation. Converting a first representation of a requested dose pattern to a sequence of control data suitable for controlling the array of individually controllable elements in order substantially to form the requested dose pattern on a substrate; converting the first representation of the requested dose pattern offline to an intermediate representation that can be rasterized in a fewer number of operations than the first representation; storing the intermediate representation in a storage device; and accessing the stored intermediate representation and producing therefrom a stream of bitmap data to be used to generate the sequence of control data substantially in real time.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 5:
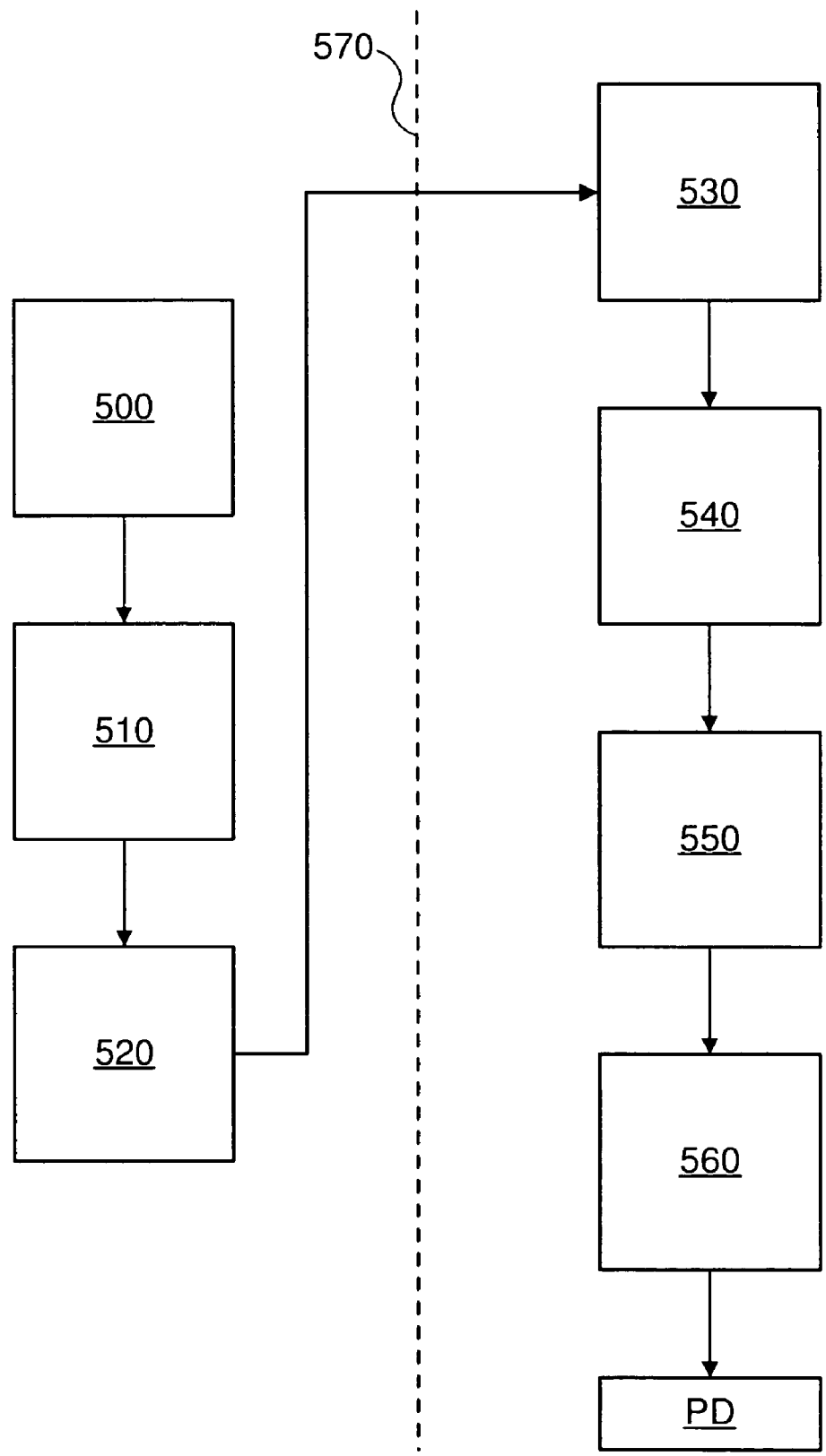
Figure 6:
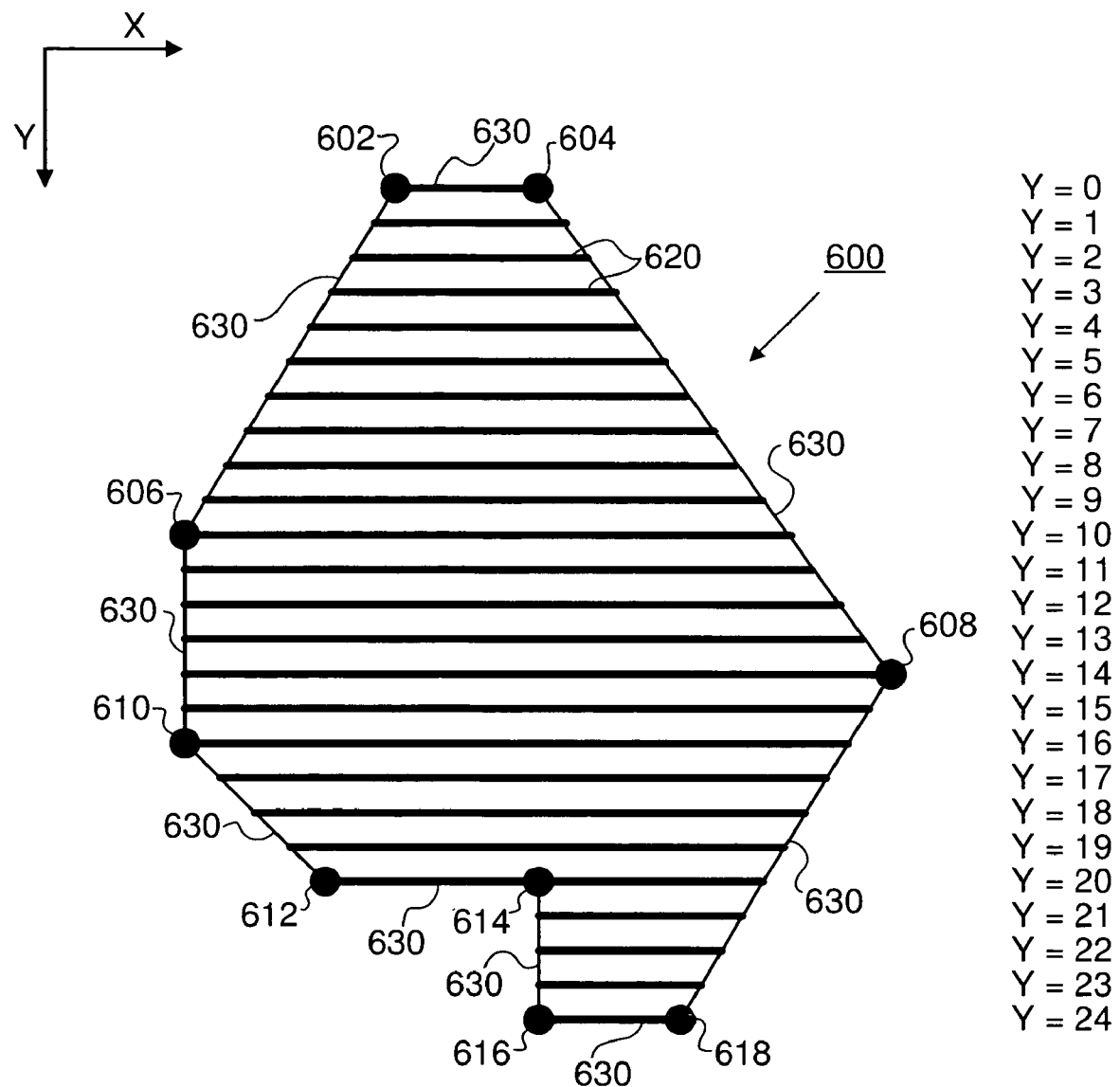
Figure 7:
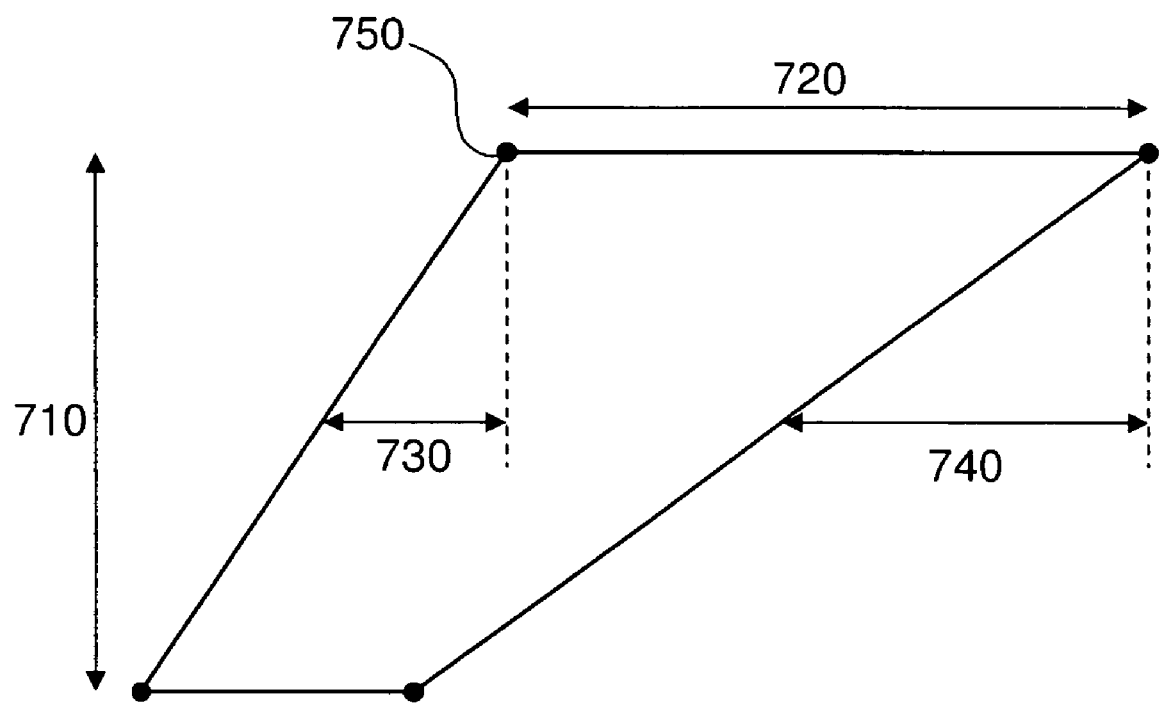
Figure 8:
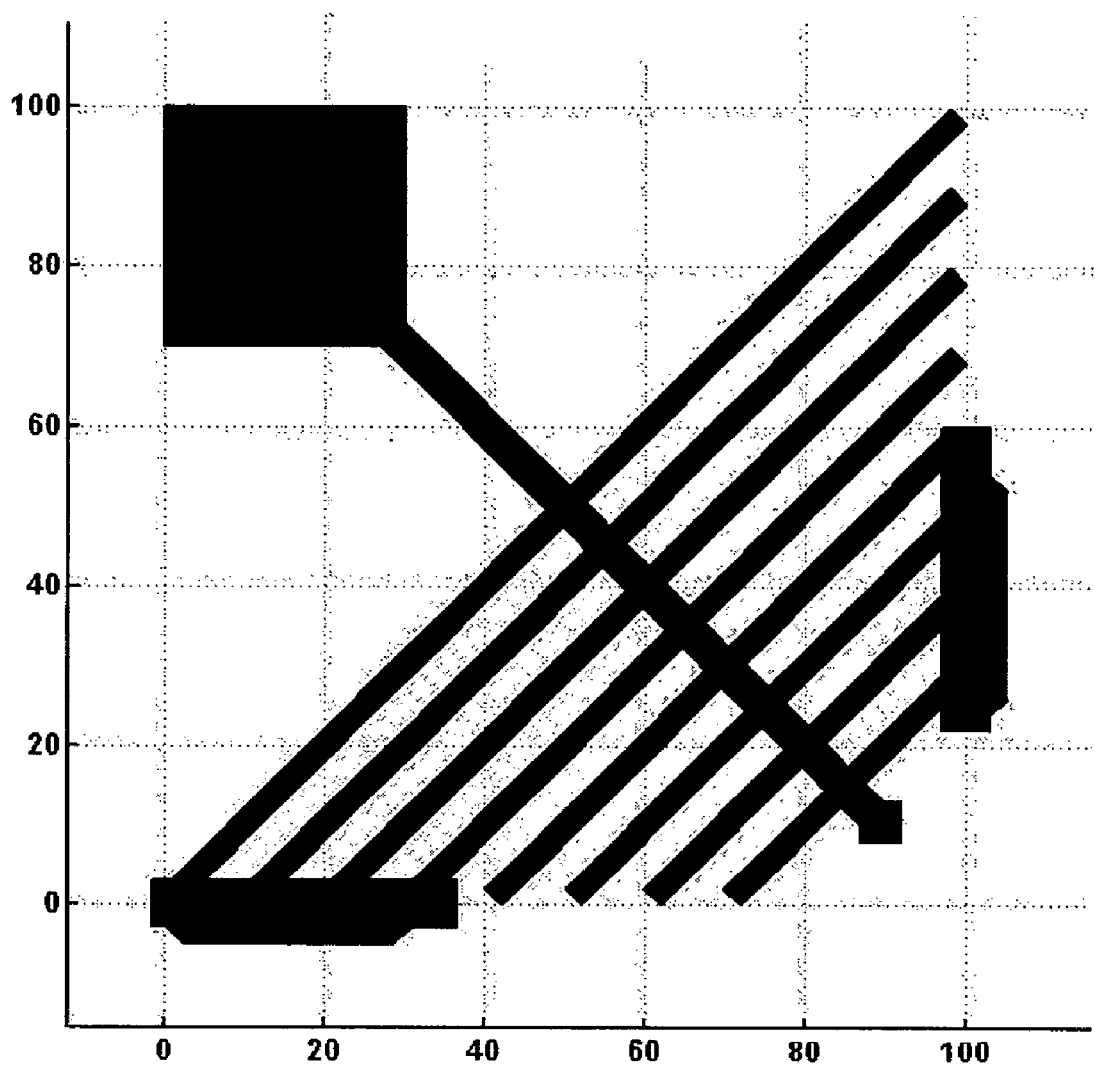
Figure 9:
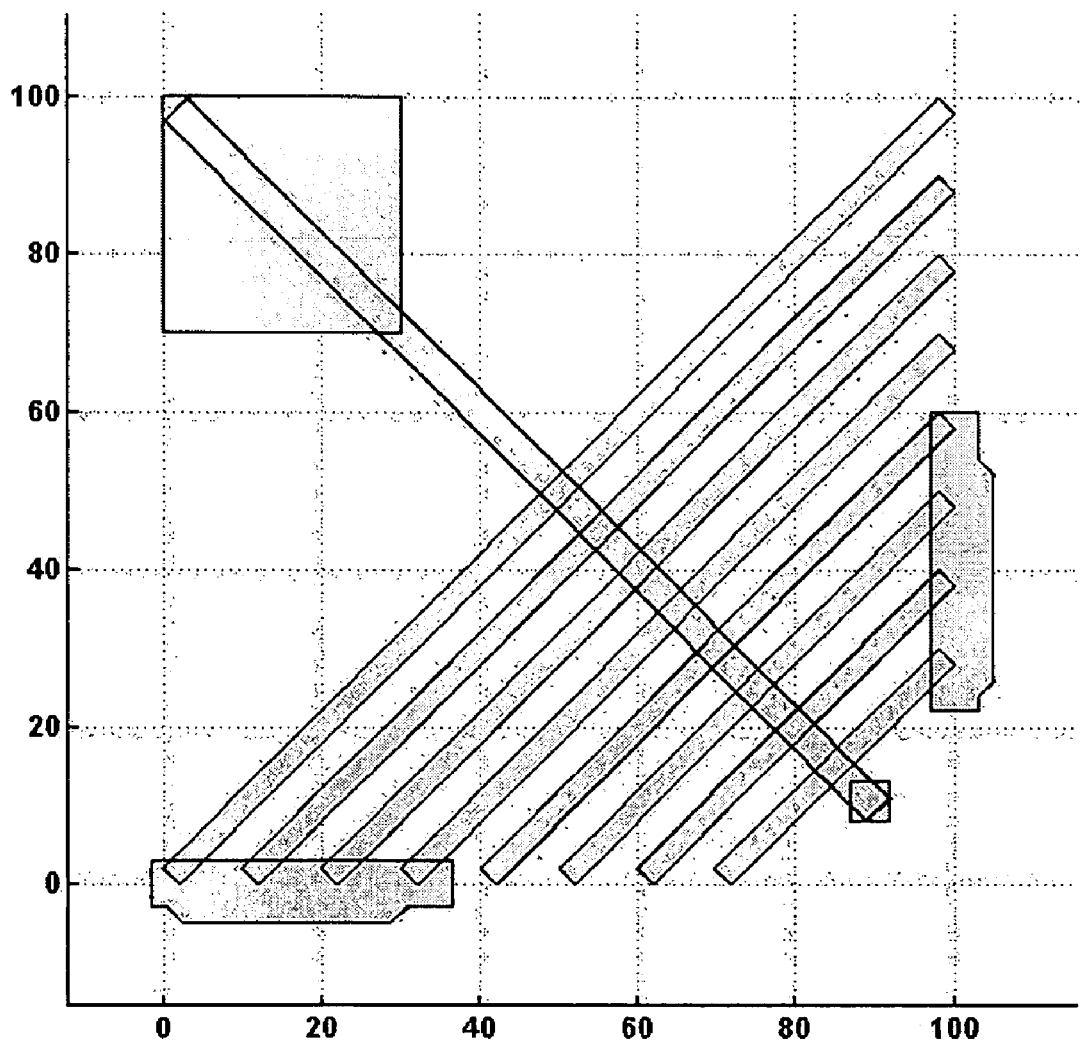
Figure 10:
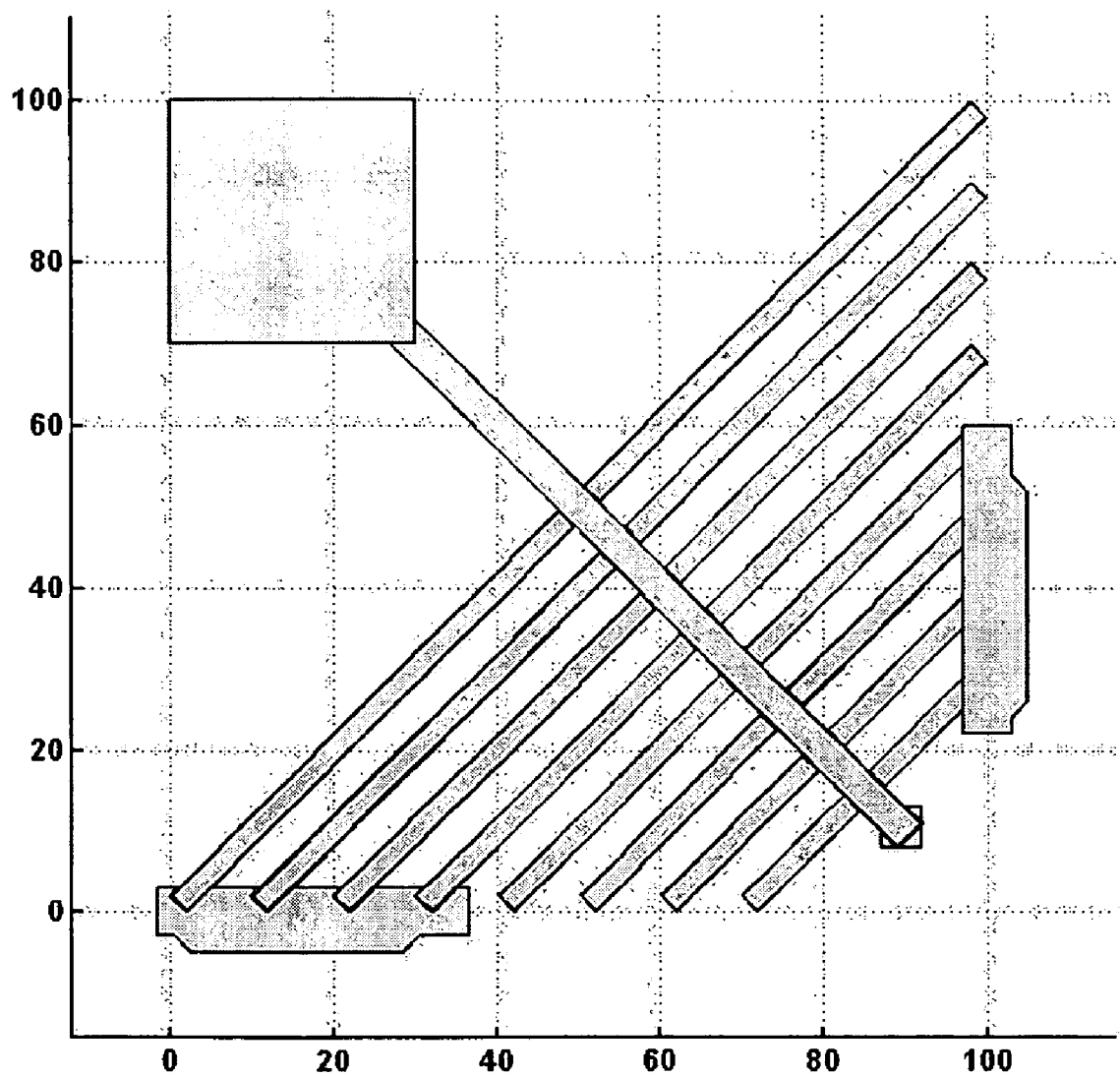
Figure 11:
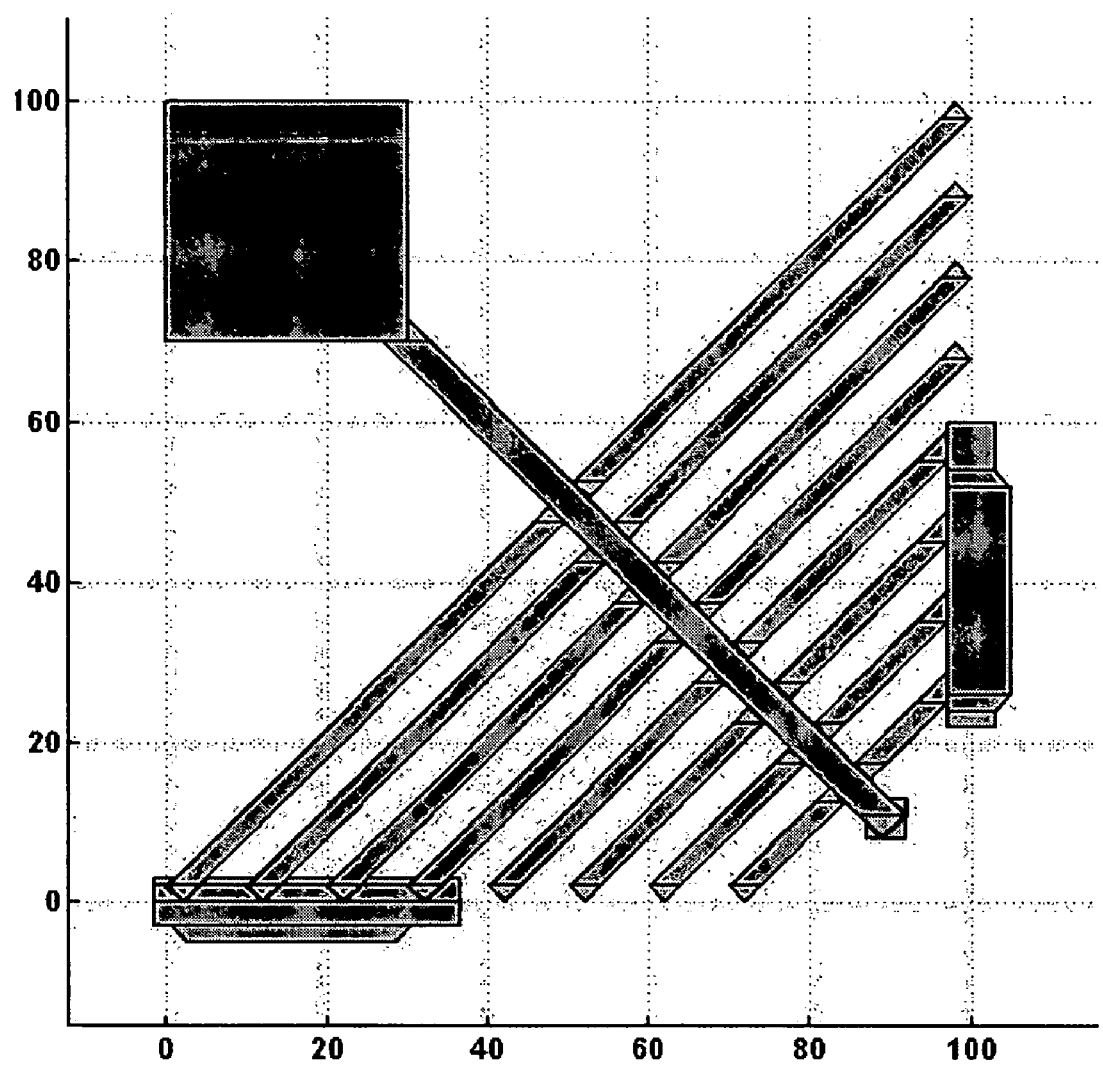
Figure 12:
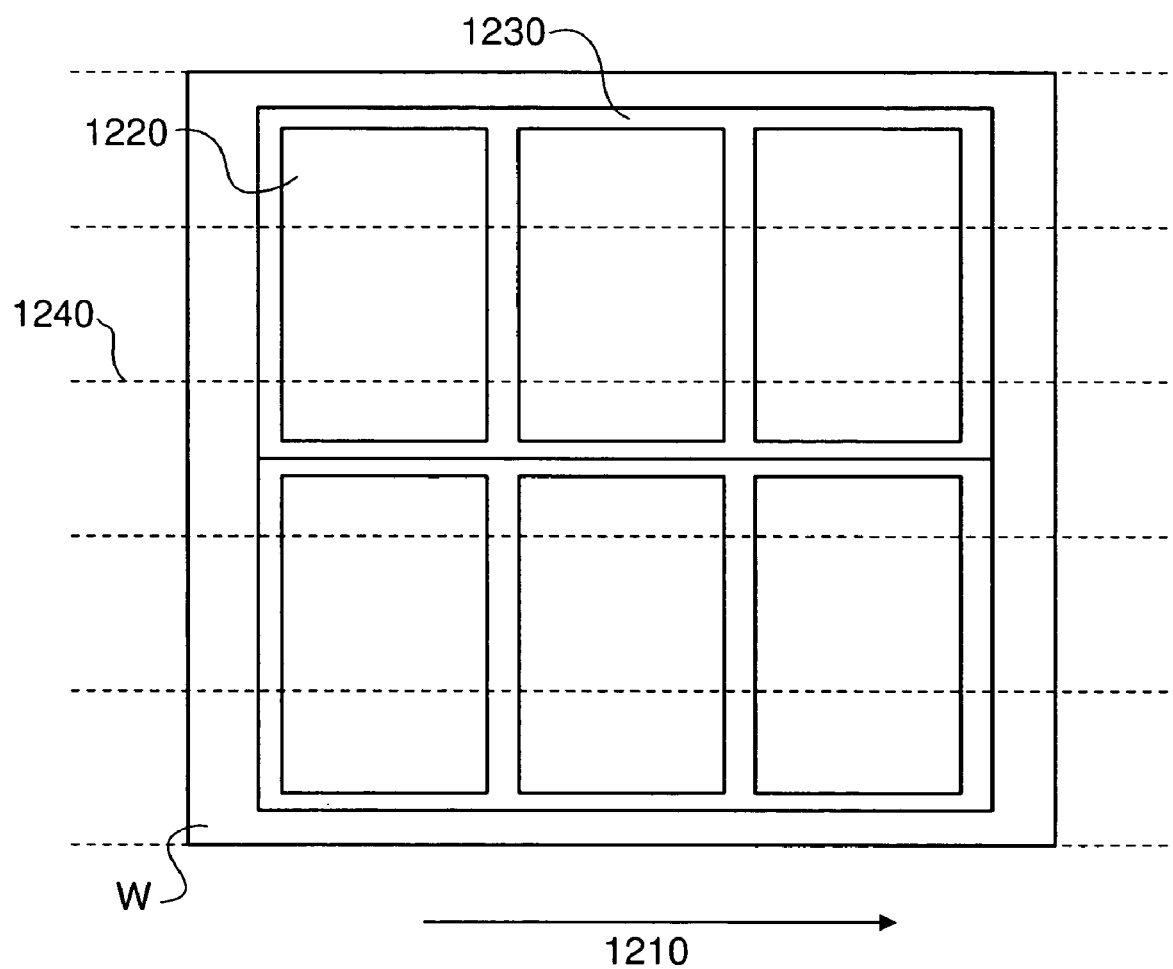
Figure 13:
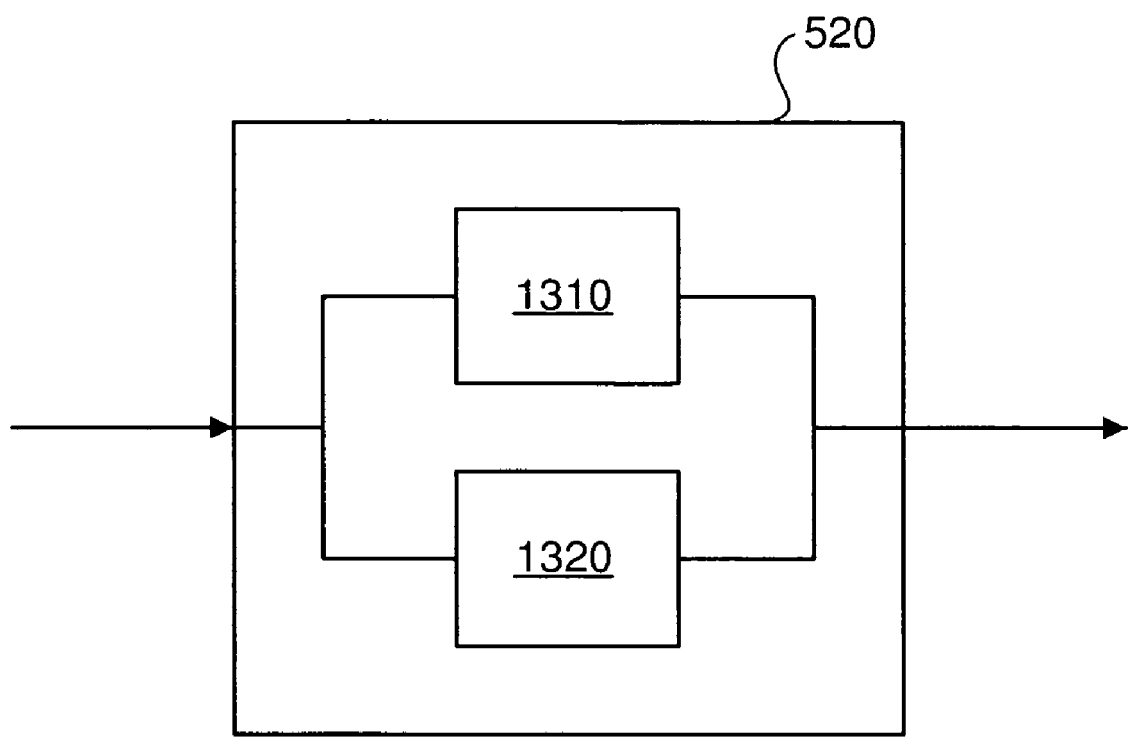

FIG. 5 depicts a data processing pipeline or "data-path," according to one embodiment of the present invention FIG. 6 depicts an example pattern to be defined by modification riles, according to one embodiment of the present invention FIG. 7 illustrates an example definition of a "trapezoid" pattern element according to one embodiment of the present invention FIG. 8 depicts an requested pattern, according to one embodiment of the present invention FIG. 9 depicts the pattern of FIG. 8 represented as a plurality of polygons, according to one embodiment of the present invention FIG. 10 depicts the pattern of FIG. 8 after processing to remove overlap between polygons, according to one embodiment of the present invention FIG. 11 depicts the pattern of FIG. 9 after processing to decompose the polygons into trapezoids, according to one embodiment of the present invention FIG. 12 depicts how a substrate can be sliced for the purposes of parallel rasterization, according to one embodiment of the present invention FIG. 13 depicts an offline pre-processor configured to deal separately with display and border areas of a flat panel display pattern, according to one embodiment of the present invention.

Figure 14:
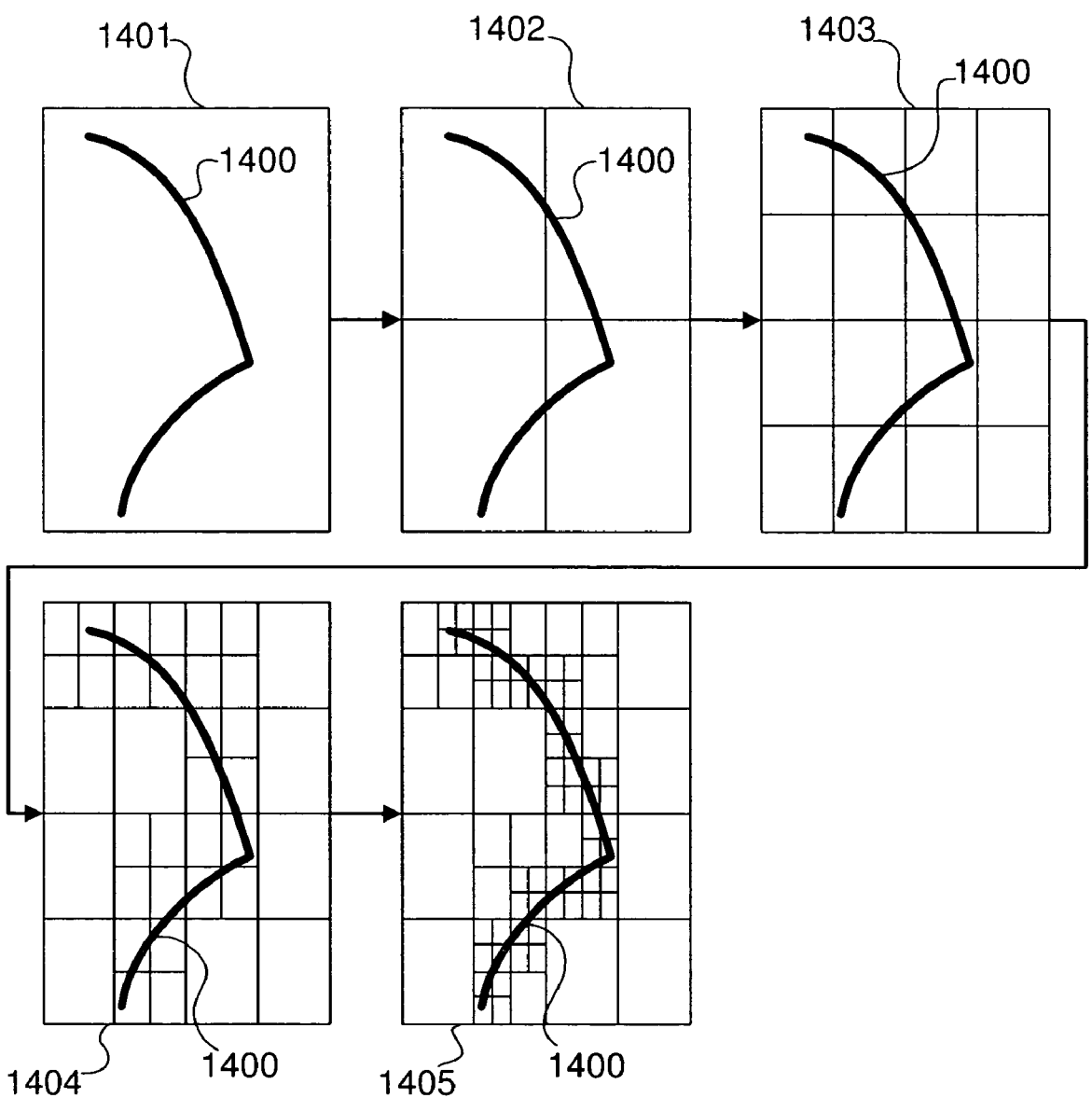
Figure 15:
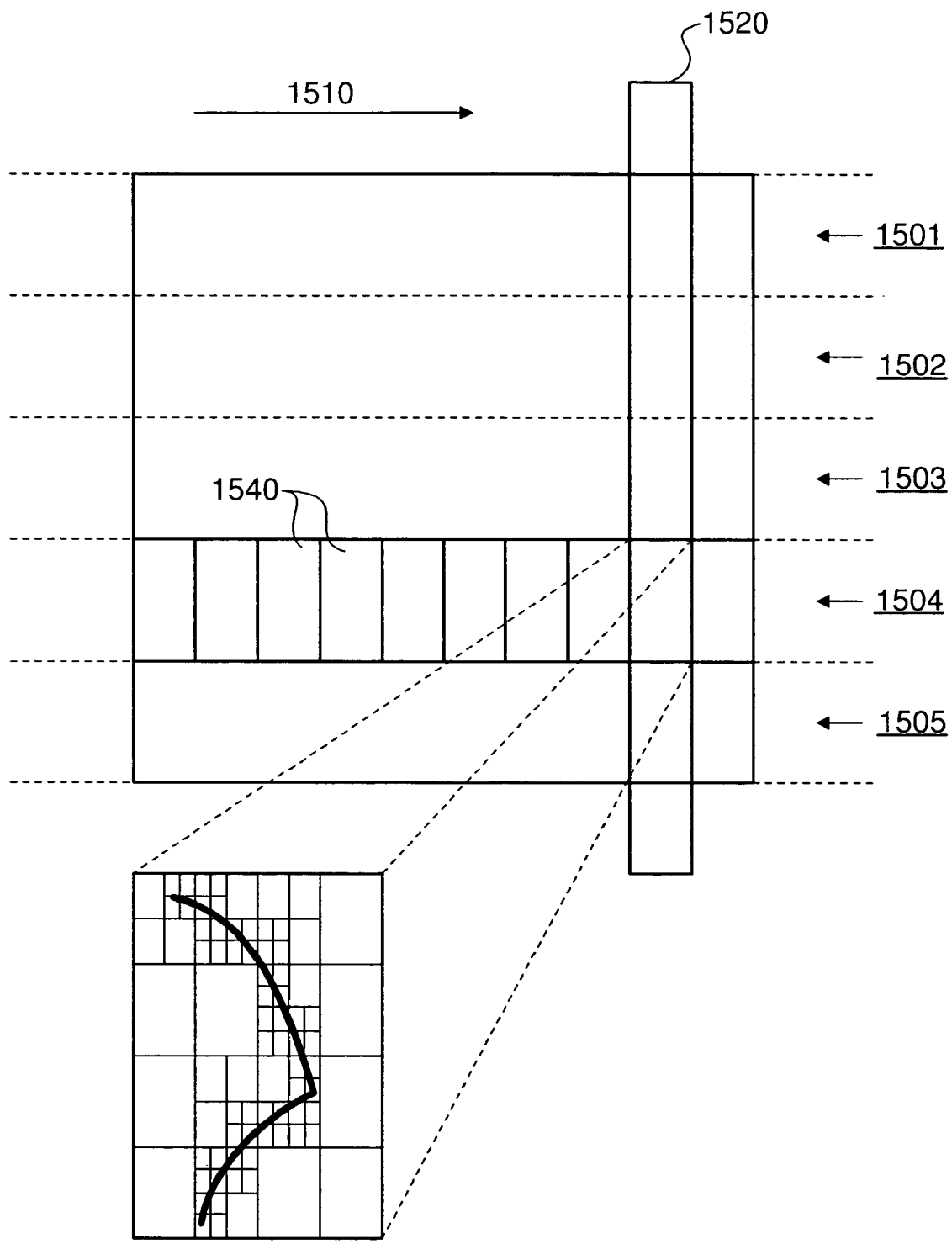

FIG. 14 depicts how a pattern can be divided in a quadtree representation, according to one embodiment of the present invention FIG. 15 depicts how a multi-tree representation can be adapted to lithography machine geometry, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
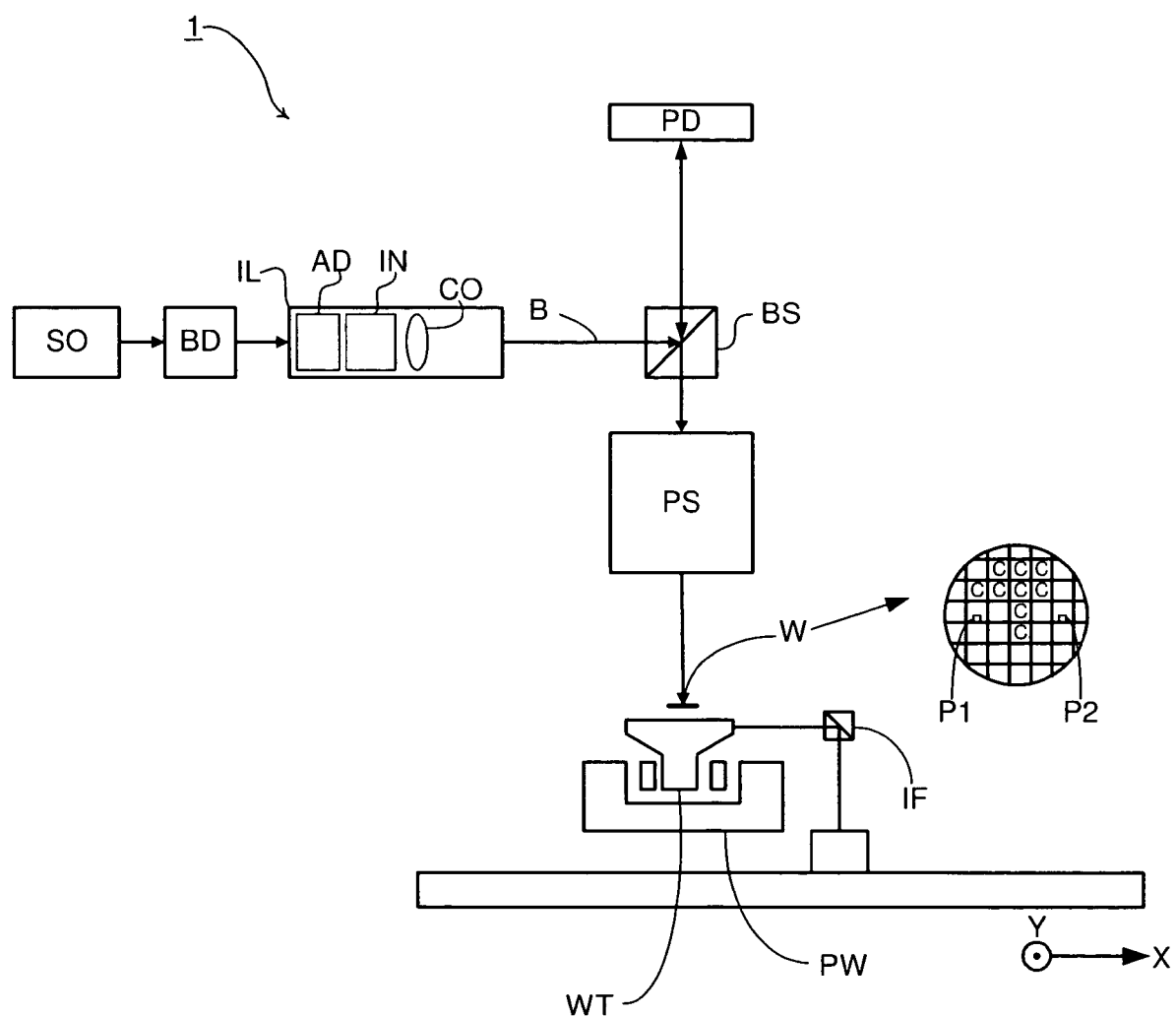
FIGS. 1 and 2 depict lithographic apparatus, according to various embodiments of the present invention.

FIG. 1 schematically depicts a lithographic apparatus according to one embodiment of the invention. The apparatus comprises an illumination system EL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
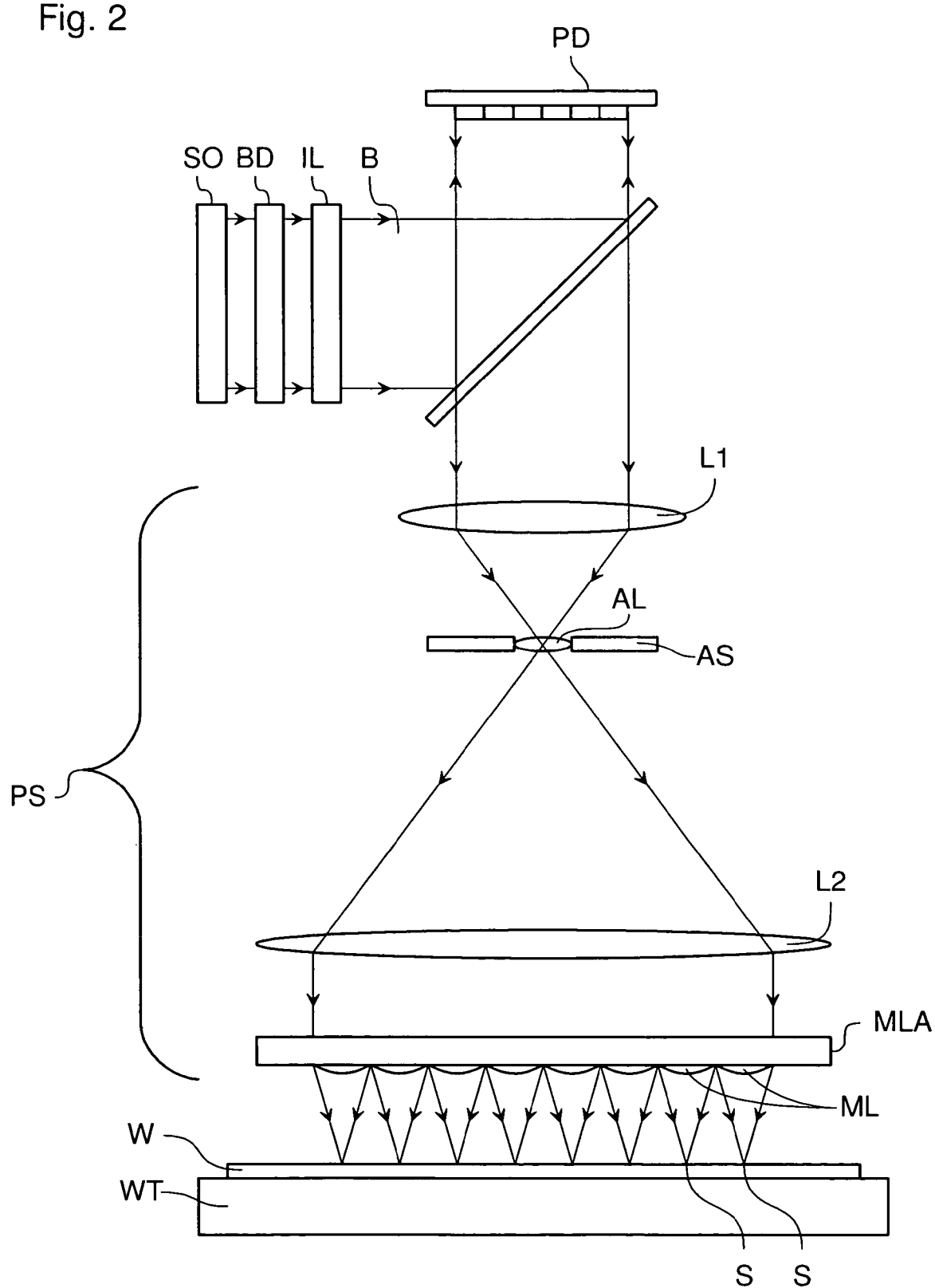

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 5 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
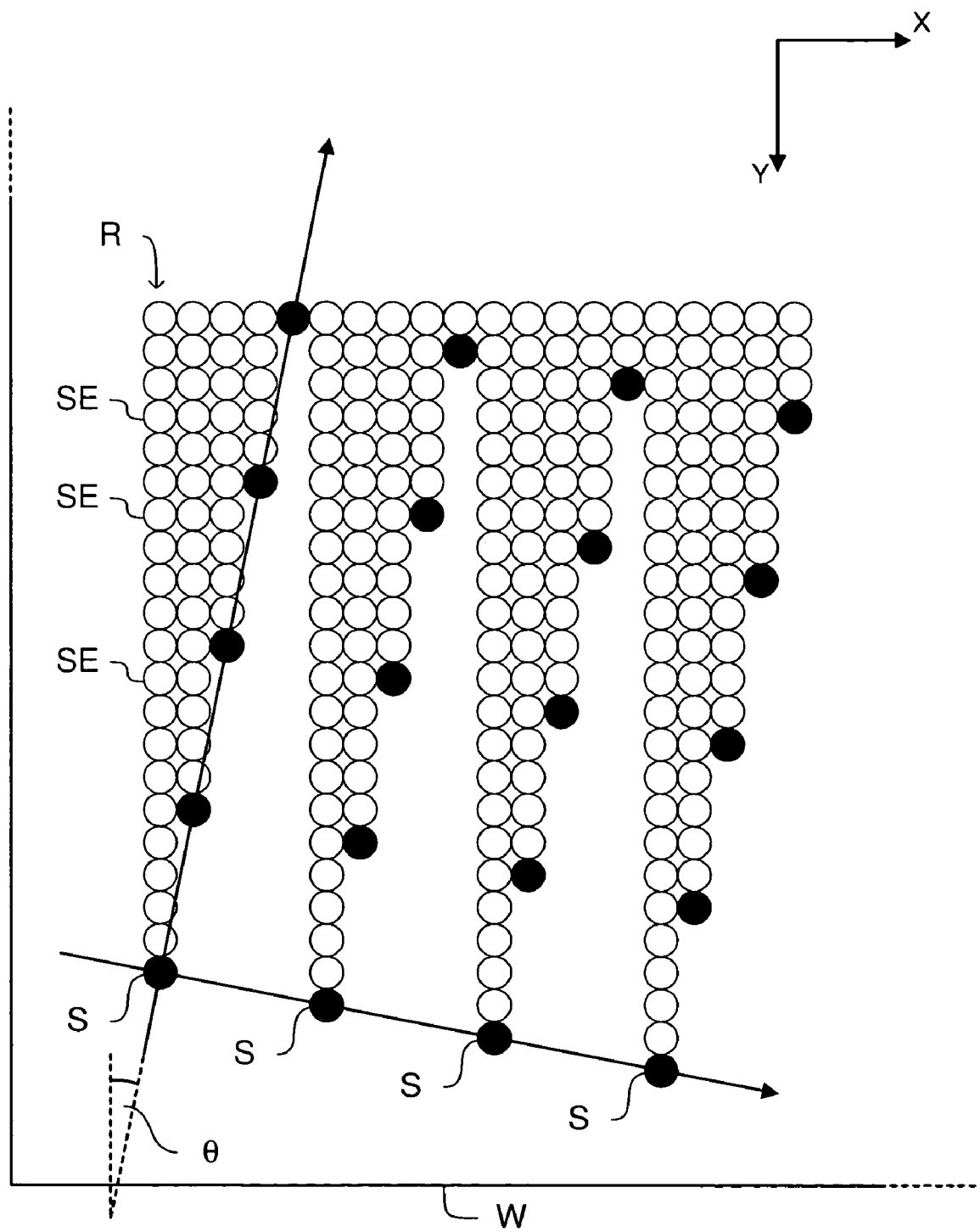
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
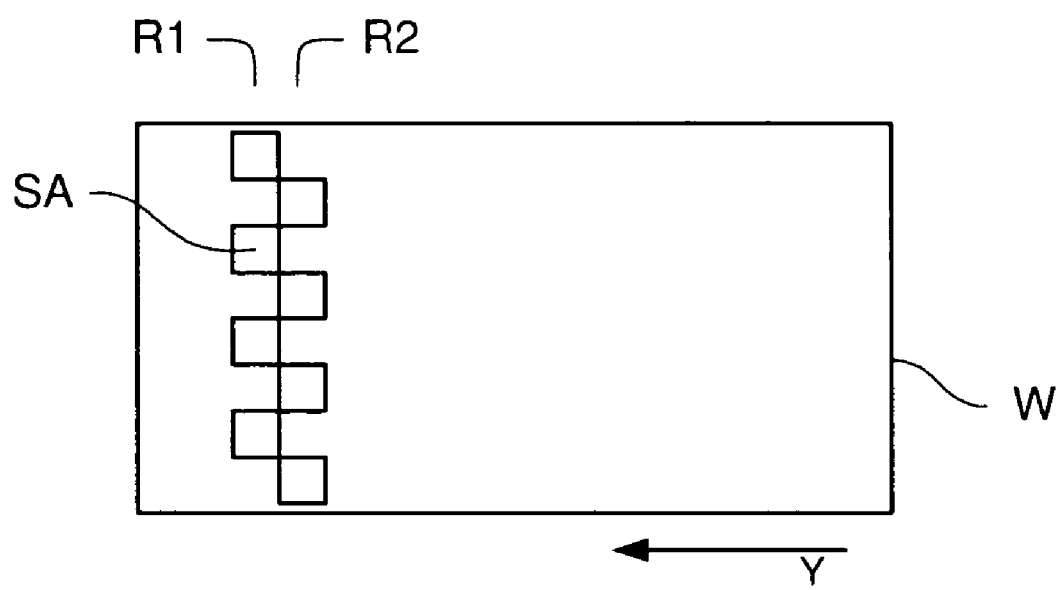
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays 31 of radiation spots S are produced by eight optical engines (not shown), arranged in two rows 32,33 in a 'chess board' configuration, such that the edge of one array of radiation spots S slightly overlaps (in the scanning direction Y) with the edge of the adjacent array of radiation spots 15. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

A device pattern and/or corresponding radiation dose pattern to be exposed on the substrate can be designed in a vector-based design package to produce a representation of the requested design in a vector-based file format such as "GDSII". The resulting pattern can be stored as a "descriptive representation." Where a vector-based design package is used, for example, the descriptive representation can store the layout of device features in terms of individual vectors describing feature contours. Additionally or alternatively, the descriptive representation can incorporate curves or other basic elements appropriate to the device being described.

Practical devices are often built up from repeating units of different types. Each of these repeating units can, in turn, be built up from a variety of repeating sub-units, etc. This repetition can be dealt with in the descriptive representation by means of a hierarchy or tree-structure, which ensures that each repeating unit only has to be described once (or, at least, does not have to be explicitly re-defined for each instance in the pattern). Higher-level units in the hierarchy can be defined, where appropriate, in terms of references to other repeating units defined once elsewhere.

Hierarchical representation is efficient in that it allows a complex repeating device pattern to be stored as a relatively small file. However, this kind of representation is not suitable for controlling the array of individually controllable elements that is to produce the pattern on the substrate. As described above, the pattern produced on the substrate by the array of individually controllable elements is built up over time by a grid of radiation spots scanned over the surface of the substrate, the intensity associated with each being controlled by particular elements of the array of individually controllable elements at particular times. The control signal that is sent to the array of individually controllable elements is therefore derived from a bitmap representation of the pattern.

A conversion is therefore necessary between the non-bitmap descriptive representation of the requested dose pattern and the bitmap version of this data that forms the basis of the control signal forwarded eventually to the patterning device. The control signal cannot normally comprise hierarchy and needs to describe each repeating feature explicitly. This leads to a dramatic increase in the volume of pattern data relative to the descriptive representation.

As an example, a flat panel display can be built up from pixels of 300×300 microns on a substrate of 2.6×2.8 meters. Each pixel is identical and has a sub-structure that can be defined in terms of 3750 corner points or vertices. This means that the patterned substrate will have 300 billion vertices associated with the display pixel pattern, which, allocating 8 bytes for each vertex, results in a pattern file in excess of 2 terabytes when no hierarchy is present (and not taking account of the pattern associated with the borders between display pixels).

These enormous file sizes mean that substantial processing power and high capacity buffer memory facilities are required to perform the offline processing of rasterizing the pattern data and compressing/storing the resulting bitmap data at reasonable expense and with minimum time delay. The need to be able to compress the rasterized data efficiently can also place unwanted restraints on the type of patterns that can be printed (e.g., a minimum level of order or maximum pattern entropy can be imposed).

According to one embodiment of the present invention, an approach is used based on a special intermediate representation of the pattern that can be stored efficiently and rasterized online. The arrangement is shown schematically in FIG. 5, which depicts the "data processing pipeline" or "data-path" that links the requested pattern input device 500 and the patterning device PD. The data-path comprises an offline part, left of broken line 570, which comprises components that operate before exposure of the substrate begins, and an online part, right of broken line 570, which comprises components that operate substantially at that same time as the substrate is actually exposed. Links between individual elements are depicted as arrows to indicate the direction of data flow. However, these continuous lines do not necessarily mean a direct data connection and further data processing devices can be arranged to operate between one or more of those shown.

According to this embodiment, a user defines the requested pattern via input device 500, which is stored as a non-bitmap descriptive representation in memory buffer 510. An offline pre-processor 520 then converts the non-bitmap descriptive representation into an intermediate representation that is suitable for rasterization substantially in real-time. The intermediate representation can be intrinsically compressed in comparison to the pure bitmap equivalent, so as to be more easily stored and extracted, but comprise data that is ordered in such a way that it can more easily be rasterized than the pure non-bitmap descriptive representation initially output from the input device 500 (for example, a GDSII file). For example, rasterization can be achieved using fewer computational operations. In particular, the intermediate representation can provide the possibility of reducing the total amount of memory that is needed for rasterization as well as the total number of memory access operations. It can also be used to limit the irregularity in the order and size of memory accesses. In particular, the intermediate representation can order data in such a way that consecutive memory accesses during rasterization are made as much as possible in consecutive memory blocks. These properties of the intermediate representation help to make rasterization possible in real time because they dictate the extent to which the rasterization can be implemented using internal memory in dedicated rasterization hardware (e.g., SRAM memory provided within hardware based on Field Programmable Gates Arrays (FPGAs)). Such internal memory can generally be accessed much more quickly than external memory but is limited in size. In addition, the intermediate representation can be arranged so that it can be rasterized without any division operations. Division operations are particular intensive in terms of the amount of memory hardware/resources required, so that creating an intermediate representation that can be rasterized without such operations greatly increases the efficiency of rasterization. The initial GDSII or vector-based representation (the "first representation") cannot normally be rasterized without division steps.

The intermediate representation of the requested pattern is passed to and stored in the online pattern memory buffer 530. The buffer 530 can be accessible by an online pre-processor 540, which can make final adjustments (such as a final level of decompression) to the data before it is passed to an online rasterizer 550, which represents the hardware that is configured to perform the rasterization algorithm itself. The rasterizer 550 is configured to supply bitmap data (or at least an easily decompressed representation of bitmap data, such as a line-by-line ID run-length encoded representation) to the rest of the data-path at a pattern transfer rate that is substantially commensurate with the rate at which the patterning device needs to receive pattern data during exposure. An online buffer 560 can be provided to allow (and correct) for variations in the rasterization speed of the online rasterizer 550.

In one example, the above arrangement circumvents the need for voluminous offline data compression calculations and storage means for dealing with the rasterized bitmap data because it no longer needs to be stored as a complete set. In fact, because the bitmap data is produced substantially in real time, only a very small fraction of the data need ever be stored at any one time.

Hierarchical data representations are intrinsically more difficult to rasterize because the data relating to a particular portion of the pattern can be distributed unpredictably in the design file in question. This lack of ordering reduces the efficiency with which the relevant data can be accessed by the rasterizing hardware, which can have a particularly damaging effect on the processing speed where the hardware is of a massively parallel type.

According to one embodiment of the invention, the offline pre-processor 520 is configured to remove one or more levels of hierarchy from the non-bitmap descriptive representation of the pattern. Features described in the resulting intermediate representation can then be re-ordered in such a way as to be more efficiently accessed by the online rasterizer 550.

In flat-panel displays, the element that is likely to be repeated most often is the display pixel itself. Therefore, it can be desirable for the offline pre-processor 520 to remove all levels of hierarchy except that of the display pixel and provide an online pre-processor 540 that is configured to remove this last level of hierarchy online. This arrangement will vastly reduce the amount of the data that needs to be stored in the pattern memory buffer 530 at the expense of having to provide additional online hardware for the online pre-processor 540. Depending on the hierarchy present in a particular pattern and the relative costs of providing extra capacity to the pattern buffer memory 530 and online pre-processor 540, the offline pre-processor 520 can be arranged to provide an intermediate representation with more or fewer levels of hierarchy.

In one example, where all levels of hierarchy are removed except that corresponding to individual display pixels, this can mean that the display area of the flat panel display is treated differently from the border areas, where the pattern does not comprise repeating display pixels. In particular, the offline pre-processor 520 can be arranged to remove all hierarchy from the non-bitmap representation of the border areas while removing all but a final level of hierarchy for the display area (the final level of hierarchy being that which takes account of display pixel repetition). Alternatively, where hierarchy/repetition is found in the border areas, the offline pre-processor 520 can be arranged to remove all but a final level of hierarchy for the border areas also, this final level corresponding to the repeating elements found in the border areas. Where the non-bitmap descriptive representation contains only a single level of hierarchy, the offline processor 520 can produce an intermediate representation which also has only a single level of hierarchy.

According to one embodiment of the invention, the intermediate representation is a compressed representation. For example, contour features can be defined in terms of vectors rather than individual pixels, the vector representation allowing groups of pixels that have a particular relationship to each other (i.e., they lie on the same line) to be expressed in a compact form. This kind of compressed representation can be seen as an extension of one-dimensional run-length encoding to two dimensions.

Vectors can be convenient because they are easily extracted from the user input descriptive representation of the requested pattern (particularly where the format is vector-based, such as GDSII). In addition, lithography patterns are commonly constructed predominantly from straight line elements, which means that they can be efficiently expressed in this way (unlike typical patterns in other image-processing scenarios, such as computer graphics or digital photographs).

The compressed pattern can be expressed in terms of vectors described by reference to a start point, an angle relative to an axis in the plane of the substrate (the scanning direction, for example), and a single coordinate of an end point. The constancy of the vector angle over a number of scan lines provides the repetition that is at the root of the run-length encoding. Other forms of repetition can also be exploited. For example, any mathematical relationship (which can be expressed as a general algebraic equation, a polynomial expansion, or in terms of constant 2nd or 3rd derivatives, for example) that links a significant number of pixels can be used as a basis for two-dimensional run-length encoding of this type.

In one example, in order for the intermediate representation to be rasterizable in real time, the pattern data needs to be made available to the online rasterizer 550 substantially in the order in which the corresponding bitmap values are to be produced so that the information can be accessed efficiently. More particularly, where the intermediate representation comprises vectors, these vectors need to be ordered in an appropriate way by the offline pre-processor 520 so that they can be efficiently accessed by the online rasterizer 550. Where the bitmap scanning order is from left-to-right (−X to +X) and top-to-bottom (+Y to −Y), Y corresponding to the scanning direction of the substrate relative to the patterning array, for example, and vectors are described in terms of the X and Y coordinates of their upper end, their angle, and the Y-coordinate of their lower end-point, the vectors can be advantageously ordered from top-to-bottom and from left-to-right in the intermediate representation file. The left-to-right aspect of the ordering can only be relevant where the vector is parallel to the X axis, in which case the end point that will be exposed first will be taken as the "upper end", or origin of the vector. In general, the top-to-bottom ordering takes priority as this defines which portion of the vector will contribute first.

The above discussion is based, for simplicity, in the "dense" bitmap domain. In an example using pixel grid imaging, the actual exposure order does not exactly follow the line-by-line scanning order of the bitmap pattern. Neighboring points in the bitmap pattern can be exposed at slightly different times. However, once the bitmap data has been produced by the online rasterizer 550, it can be re-ordered relatively easily to form the control signal for the patterning array without departing from the scope of the invention. Similarly, straightforward adjustments to the rasterization process itself can be made so as to produce pixel values substantially in the order in which they will be needed for the exposure.

In one example, the vectors (or other geometric unit representing a portion of the pattern with constant mathematical properties) can be used to establish "modification rules" for the pattern, which define for each line of bitmap values (e.g., corresponding to a line of constant Y in the requested dose) how they are different from the bitmap values of a preceding line. Where the pattern is expressed in terms of vectors, these modification rules will be defined by the vectors that will cross the line in question and will need to be updated whenever a line includes a new vector portion or when a previously applicable vector portion no longer crosses the line in question (i.e., it ended in the preceding line).

According to one embodiment of the invention, the modification rules themselves are stored as two numbers: an X-position, and a step in X for a fixed change in Y (i.e., the description of the angle in a mathematical line equation $x=ay+b$, and the same description as the "angle" referred to in the intermediate representation.

The intermediate representation can be expressed, for example, as a stream of data packets representing modification rule updates on a line-by-line basis (i.e., the modification rule update for a given line can define how the group of modification rules that are relevant for that line will be different from the group of modification rules that were relevant for the preceding line). This representation is compressed because only changes (updates) to the modification rules need be recorded in each data packet. These changes will represent a smaller amount of data than the corresponding lines of bitmap values (and even the corresponding list of relevant modification rules) due to the vector (or at least geometrically constant) nature of the data represented by the modification rules, which reduces the number of changes that will be required for each line. The order of these data packets should correspond substantially to the order in which the lines of dose pattern corresponding to the lines of bitmap values will be rasterized (which is closely related to the order in which they will be exposed). This provides the advantage that the data can be accessed and rasterized efficiently as discussed above. The hardware in the online rasterizer 550 can be based on an FPGA architecture and can be configured directly to convert this stream of modification rule updates to a bitmap pattern suitable for being used to form the control signal for the patterning array.

In the above example(s), modification rules have been described as defining how bitmap values change from line to line. It should be understood, however, that in practice the modification rules can define how a representation of the bitmap values changes from line to line. This representation can be compressed, for example using ID run-length encoding. This is likely to lead to a large reduction in the data volume leaving the rasterizer and should be straightforward to decode in real-time. The ID run-length encoding option is likely to be particularly efficient and easy to implement where bitmap values are restricted to being either black or white. However, a more complex representation can be required in order to cope with gray scale patterns. Here, the bitmap values are liable to change more continuously along a line of dose pattern. 1-D compression of this type of data might be carried out by exploiting constant properties of the bitmap value transitions. For example, it can be that bitmap values change at a constant rate with respect to the X direction, in which case a gradual transition can efficiently be represented by means of a starting pixel (defined as a position along X), a rate of change of bitmap value along X, and an end pixel (again defined as a position along X).

Representations of vectors, angles, modification rules and modification rules updates other than those referred to above can also be used without departing from the scope of the invention.

Alternatively or additionally, the vectors can be ordered in the intermediate representation by reference to the coordinates of their upper left end (i.e., the part of the vector that will be exposed onto the substrate first) only, so that those with the highest Y coordinate can be accessed earlier than those with a lower Y coordinate (as mentioned above, this is true in the "dense" or bitmap domain, but the situation will be more complex in the pixel grid imaging domain because the order of exposure of pixels is not a simple function of X and Y). The modification rule updates that add modification rules describe where vectors begin and in what direction they are going. They do not say anything about their length/end-point. This is handled by separate modification rule updates that remove modification rules. Or, in other words, the end of a vector is reached when a modification rule update is found for the current Y position that removes the modification rule dealing with the vector in question. The algorithm responsible for rasterizing the intermediate representation will parse the file from beginning to end, which, as mentioned above, will contain modification rule updates arranged in order of increasing Y. Therefore, the algorithm will begin with Y=0 and will increase Y the first, should be an addition of a modification rule pair). The modification rules will then be executed and Y incremented until Y reaches the value of the next modification rule update in the file. Note that this second modification rule update can have the same Y value as the first one. This process will continue until Y reaches the maximum value (i.e., the end of the substrate).

FIG. 6 illustrates how a shape 600 can be described in terms of modification rules and modification rule updates, according to one embodiment of the present invention. The shape 600 is built up over 25 scan lines (labeled Y=0 to Y=24) perpendicular to the scanning direction Y. Its outline is defined by contour segments 630 within which the bitmap pixel values are set to black and outside of which the bitmap values are set to white. As has been described above, the intermediate representation can comprise modification rule updates, which describe how the modification rules change from line to line and are ordered in the intermediate representation in the sequence in which they are needed for rasterization. In the example shown, the first modification rule updates will be found by the rasterization algorithm at line Y=0 and will consist of the introduction of a transition pair, corresponding to the contour outlines starting from points 602 and 604. The pair of modification rules introduced describe the position of the starting points 602 and 604 and also the angle at which the respective contours descend towards points 606 and 608. Both these modification rules will remain valid until the algorithm reaches Y=10 at which point one of the modification rules will need to be changed to reflect the change in angle of the left contour at point 606. This is represented by a single modification rule describing the change in angle. The next two modification rule updates will be of the same type and are encountered at Y=14 (point 608) and Y=16 (point 610). The update on line Y=20 represents a shift along X so that the starting position and angle will need to be redefined by the modification rule update. Finally, at point Y=24, the modification rule update will define the removal of a modification rule pair, corresponding to the end of the vectors respectively linking points 614 and 616, and 608 and 618.

For patterns of this type, the modification rules updates can be split into at least four generic types: (1) the addition of a pair of modification rules (the first member of the pair describing the start of a feature to be represented in a particular line of bitmap values and the second member of the pair describing the end of the feature, and thereby the thickness of the feature where it crosses the line; (2) the removal of a pair of modification rules (when a feature ends—it is assumed that the feature has a finite thickness before ending so that a pair of modification rules, rather than a single modification rule, were needed in the previous line); (3) a change of angle of a modification rule (representing a change in angle of one side of the contour being described by the modification rule); and (4) a change in the X-coordinate of a modification rule (representing a ledge-type shape in one side of the contour being described by the modification rule).

The two-dimensional run-length encoding can be applied not only to dose patterns defined by a black and white pixels, but also to those defined by gray-scale bitmap patterns (i.e., bitmaps with one or more values between those used for black and white). Such patterns can be represented in the intermediate representation as contours that are defined relative to sub-grid positions in the bitmap pixel grid. For example, a contour passing through a bitmap pixel at a height of $5/8$ of the pixel can be rasterized as a pixel with a "gray" value of $5/8$ (where 0 is black and 1 is white) or some other appropriate "gray" value that is associated with the value of $5/8$.

FIG. 7 illustrates a trapezoidal approach, according to one embodiment of the present invention. This is an alternative (or in addition) to the special two-dimensional run-length encoded format described above, in which a trapezoid representation (a limited polygon representation) can be used ("trapezoid" is here understood to mean a quadrilateral with two parallel sides). Here, the requested pattern is decomposed into trapezoids can be expressed in terms of an origin (X,Y) 750, height 710, width 720, first gradient dX/dY 730, and second gradient dX/dY 740. Other representations can also be used. As before, individual features (or parts of features) can advantageously be re-ordered in the intermediate representation for the purposes of efficient rasterization. For example, they can be re-ordered by reference to their origins 750 and the sequence in which each origin will be exposed/rasterized. However, implementation constraints can impose other orderings.

In one example, the GDSU data can be expressed in terms of any set of basic shapes ("rasterization primitives") that reduces the complexity of the hardware required to implement the online rasterizer 550. 2D run-length encoding and trapezoids have been mentioned above, but other primitives can include triangles, rectangles or other polygons of restricted complexity. Whichever primitives are chosen, the offline pre-processor 520 performs the operation of breaking pattern shapes down into the primitives.

In one example, the simplest primitives for the rasterizer would be rectangles because the rasterization algorithm normally converts the polygons of the pattern into pixels values that are on an orthogonal pixel grid. However, a rectangles can lead to large amounts of memory being required for storage of non-orthogonal shapes. The trapezoid is a more efficient primitive in this respect, defined only with two opposing sides that follow pixel reference axes (X and/or Y). To handle this primitive, the rasterization engine can fill pixels, following scan lines: starting from one slanted line, filling up the area until the next slanted line is reached and repeating this process line by line until the trapezoid is done.

FIGS. 8 to 11 illustrate how an example pattern can be processed by the offline pre-processor 520, according to one embodiment of the present invention. FIG. 8 illustrates the example pattern as designed by a user. FIG. 9 shows how this pattern can be built up from polygons in the descriptive (GDSII) representation. These are processed in a first stage to remove the overlap and produce the pattern shown in FIG. 10. Removing overlap ensures that pixels are not rasterized more than once, which can cause unnecessary repetition of work for the rasterizer and reduce overall performance. In addition, errors in pixel exposure dose can occur: for example, "greater than black" or "greater than white" pixels (due to overwriting). This problem could be solved by clipping to black or white, but this solution will not be applicable where halftoning is being used. In addition to dose errors, overlaps can also lead to pattern position errors. In the next stage, the resulting shapes are then decomposed into individual trapezoids as shown in FIG. 11, which can be described and stored as discussed above.

The offline pre-processor 520 can be configured to divide the pattern data into portions corresponding to different slices of the requested pattern. These portions can be processed independently and forwarded to separate online preprocessors and online rasterizers. For example, a single offline pre-processor 520 can be arranged to produce a plurality of files corresponding to intermediate representations of different slices of the pattern. The plurality of files can then be forwarded to a corresponding plurality of online rasterizers so as to be rasterized in parallel. Each of the slices can correspond, for example, with a portion of the pattern to be exposed by one of the optical engine spot arrays SA. The above arrangements and/or combinations thereof can allow the overall online rasterization to be carried out more efficiently (i.e., using a smaller number of computing operations—for example, multiplication or memory access—and/or more quickly for a given cost of apparatus).

FIG. 12 shows how a pattern for an entire substrate can be divided, according to one embodiment of the present invention. The substrate W is depicted relative to a horizontal scanning direction (indicated by arrow 1210). The requested pattern comprises six flat panel displays defined by display areas 1220 (comprising display pixels) and border areas 1230 (comprising patterns for connecting wires, etc.). The overall pattern is divided into five slices, delimited by broken lines 1240.

FIG. 13 depicts an offline pre-processor 520 configured to exploit the difference in content between the display and border areas of patterns for flat panel displays, according to one embodiment of the present invention. In this embodiment, offline pre-processor 520 comprises two compression devices: a display area compression device 1310 and a border area compression device 1320. The display area compression device 1310 can operate using a dictionary-based compression algorithm, for example, based on a single dictionary entry for each type of display pixel in the display (normally, only one type of pixel will be used), or other suitably specialized compression method. The border regions, on the other hand, are likely to be less well-ordered and are dealt with by the border area compression device 1320 using two-dimensional run-length encoding or trapezoid decomposition as discussed above. By applying compression algorithms that are better adapted to the input pattern, compression and/or decompression can be achieved more effectively.

As discussed above, the bitmap expansion of the GDSII vector representation of the mask layout (and therefore device pattern) can be extremely large. When the image contains repetitive patterns, image compression can reduce the amount of data considerably, reducing storage demands and data transport times. However, it has proven difficult to design a de-compression algorithm that can output the pixel values at the required rate (for example, $10^{10}$ pixels/sec) for a reasonable cost and reliability.

According to one embodiment of the invention, a quadtree representation is adapted for this purpose. In particular, the offline pre-processing device 520 is configured to convert the non-bitmap descriptive representation to a quadtree representation, which can be rasterized online.

In one example, the quadtree representation comprises a recursive tree, in which the image is divided into four parts at each node. Each of the four parts can be characterized by the extent to which they are filled by the pattern to be represented. Each part is then split again into four and the process continues until branch termination conditions are achieved for all branches. For example, a branch can terminate when all of the quadrants under a given node are filled completely, or filled above a predetermined threshold value. Additionally, a branch will terminate when all four quadrants are empty.

FIG. 14 shows how a pattern 1400 can be divided in order to build up a quadtree representation, according to one embodiment of the present invention. The process is shown in five steps: 1401, 1402, 1403, 1404, and 1405. Frame 1401 represents the root node and is undivided. The first division into four quadrants is shown in frame 1402. Each of the four quadrants are partially filled by portions of the pattern 1400, and are therefore each divided further. In frame 1403, not all of the quadrants are partially filled, the empty ones will be divided no further and this fact will be recorded in the file (these are the "leaves of the tree"), while the partially filled quadrants will be divided further. The next levels of division are shown in frames 1404 and 1405. It can be seen that the grid is defined more densely around the pattern 1400, where it is most needed, and less densely elsewhere. This allows efficient representation of the pattern because fewer bytes are required where the grid is less dense.

Software for converting a GDSII file to a quadtree representation is commercially available so that this functionality of the pre-processor 520 can be implemented at low cost. In one example, the decompression algorithm involving a recursion means will implemented effectively in hardware (particularly in a massively parallel processing environment) because the recursion will involve a number of identical steps, which can be executed on processors allocated from a pool of identical processors. The quadtree method is particularly suitable for representing black and white bitmap patterns. Gray tone pixels could be achieved, for example, by first generating a high resolution black and white image and converting blocks of black and white pixels into single gray tone pixels. For example, a 15 by 15 array of 50 nm pixels can be converted to a single gray tone pixel of 750 nm square.

In one example, a particularly efficient representation can be obtained by allowing the quadtree to start in a more flexible manner. For example, instead of splitting the pattern into four quadrants for the first node, the pattern can be divided into a different number of regions of variable geometries (this can be termed a "multi-tree" representation because, where subsequent nodes are treated in the normal quadtree representation, it effectively comprises a plurality of normal quadtree representations). In this way, a special quadtree representation can be achieved that is better adapted to the lithography apparatus. For example, the first division can be arranged to be in units that reflect the machine geometry. For example, the pattern can be split into parts that represent the exposure window and strokes of the exposure window that are projected by one of the optical system spot arrays SA as the substrate W is scanned past. More particularly, in systems comprising a plurality of patterning arrays, the pattern can be split into portions that represent regions exposed by particular patterning arrays (and/or particular portions of patterning arrays) at particular times, in such a way that the entire pattern is represented and the data associated with particular areas of the pattern can efficiently be rasterized in the order in which they are required.

FIG. 15 shows an arrangement, according to one embodiment of the d present invention. The pattern is divided into a number of parallel strips 1501, 1502, 1503, 1504 and 1505, which allow the image processing to be split between different optical systems and different parts of the data-path architecture. An exposure window, which represents a region of the pattern that is exposed during a particular period is shown by rectangle 1520 and the substrate W is arranged to move relative to the projection optics in the sense indicated by arrow 1510. The multi-tree root nodes are illustrated for strip 1504 as regions 1540. The region 1540 overlapping at the instance shown in the diagram with the exposure window has been expanded to illustrate how the pattern contained therein can be dealt with by a quadtree representation for all nodes below that multi-tree root node.

According to this embodiment, the decompression can then be carried out in parallel for each optical engine (because the first node is limited to be entirely within the region of the pattern dealt with by one engine). Alternatively or additionally, in the case where the bitmaps resulting from expansion of each of the regions 1540 in a given slice are needed at different times, individual decompression of the pattern within the corresponding regions can be carried out in an appropriate sequence. Because the pattern has been split up as part of the conversion process to the quadtree representation, there is no longer any need to decompress the whole pattern in one operation. Selected portions can be decompressed at selected times according to the needs of the lithography apparatus.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer. imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A lithographic apparatus, comprising:
   an array of individually controllable elements that modulate a beam of radiation;
   a data processing pipeline that converts a first representation of a requested dose pattern to a sequence of control data suitable for controlling the array of individually controllable elements to substantially form the requested dose pattern on a substrate, wherein the data processing pipeline comprises:
   an offline pre-processing device that converts the first representation of the requested dose pattern to an intermediate representation that is rasterized in a fewer number of operations than the first representation;
   a storage device that stores the intermediate representation; and
   an online rasterizer that accesses the stored intermediate representation and produces therefrom a stream of bitmap data to be used to generate the sequence of control data substantially in real time.

2. The lithographic apparatus according to claim 1, wherein the intermediate representation is rasterized in a fewer number of memory access operations than the first representation.

3. The lithographic apparatus according to claim 1, wherein the intermediate representation is rasterized using less computational hardware than the first representation.

4. The lithographic apparatus according to claim 1, wherein the first representation represents repeating groups of elements in the requested dose pattern using a hierarchy.

5. The lithographic apparatus according to claim 4, wherein the intermediate representation contains at least one level of hierarchy less than the first representation from which it is derived.

6. The lithographic apparatus according to claim 5, wherein the intermediate representation has only a single level of hierarchy.

7. The lithographic apparatus according to claim 6, wherein the requested dose pattern corresponds to a device layer in the manufacture of Flat Panel Displays and the single level of hierarchy represents a plurality of identical Flat Panel Display pixels.

8. The lithographic apparatus according to claim 1, wherein the offline preprocessing device divides requested dose pattern data in the first representation into a plurality of portions, each corresponding to a particular region of the requested dose pattern, and wherein each portion is converted to an intermediate representation and rasterized separately.

9. The lithographic apparatus according to claim 1, wherein the first representation expresses the requested dose pattern in terms of overlapping geometric units and the pre-processing device produces an intermediate representation in which the overlap is at least partially removed.

10. The lithographic apparatus according to claim 1, wherein:
   each portion of the requested pattern represented by a vector in the first representation is represented in the intermediate representation by the X and Y coordinates of a first point of the vector to be exposed, an angle of the vector relative to an axis lying in a plane of the substrate, and the Y-coordinate or X-coordinate of a last point of the vector to be exposed;

the X and Y axes are orthogonal axes lying in the plane of the substrate; and the Y-axis is substantially parallel to a scanning direction of the substrate relative to the array of individually controllable elements.

11. The lithographic apparatus according to claim 1, wherein:

portions of the requested pattern represented by curves in the first representation are each represented in the intermediate representation by the X and Y coordinates of a first point of a curved portion to be exposed, a mathematical relation describing a shape of the curved portion, and the Y-coordinate or X-coordinate of a last point of the curved portion to be exposed; and the X and Y axes are orthogonal axes lying in the plane of the substrate and the Y-axis is substantially parallel to a scanning direction of the substrate relative to the array of individually controllable elements.

12. The lithographic apparatus according to claim 1, wherein:

the bitmap data is composed of a sequence of lines of bitmap values, ordered substantially according to an exposure sequence of portions of the requested pattern defined by the lines;

a plurality of modification rules define how the bitmap values change from line to line in the sequence of lines;

each one of at least a subset of the modification rules is derivable from a corresponding portion of the requested dose pattern represented by a vector and is applicable for all lines affected by that vector; and the offline pre-processing device produces an intermediate representation comprising a sequence of data packets, each describing how a group of modification rules relevant for a given line is different from a group of modification rules relevant for a preceding line.

13. The lithographic apparatus according to claim 12, wherein: the bitmap data uses a 1-dimensional run-length encoding to represent each line of bitmap values; and the modification rules define how the 1-dimensional run-length encoding of each line of bitmap values changes from line to line in the sequence of lines.

14. The lithographic apparatus according to claim 1, wherein: the bitmap data is composed of a sequence of lines of bitmap values, ordered substantially according to an exposure sequence of portions of the requested pattern defined by the lines;

a plurality of modification rules define how the bitmap values change from line to line in the sequence of lines;

each one of at least a subset of the modification rules is derivable from a corresponding portion of the requested dose pattern represented by a curved section with constant properties and is applicable for all lines affected by that curved section; and the offline pre-processing device produces an intermediate representation comprising a sequence of data packets, each describing how a group of modification rules relevant for a given line is different from a group of modification rules relevant for a preceding line.

15. The lithographic apparatus according to claim 14, wherein: the bitmap data uses a 1-dimensional run-length encoding to represent each line of bitmap values; and the modification rules define how the 1-dimensional run-length encoding of each line of bitmap values changes from line to line in the sequence of lines.

16. The lithographic apparatus according to claim 1, wherein portions of the requested pattern represented by vectors in the first representation are re-ordered by the offline pre-processing device and stored in the intermediate representation in such a way as to be accessible to the online rasterizer substantially in the order in which each vector contributes to the sequence of control data.

17. The lithographic apparatus according to claim 1, wherein portions of the requested pattern represented by curves in the first representation are re-ordered by the offline pre-processing device and stored in the intermediate representation in such a way as to be accessible to the online rasterizer substantially in the order in which each curved portion contributes to the sequence of control data.

18. The lithographic apparatus according to claim 1, wherein features of the first representation are described in the intermediate representation in terms of a plurality of non-overlapping polygons.

19. The lithographic apparatus according to claim 18, wherein the polygons are ordered by the offline pre-processing device and stored in the intermediate representation in such a way as to be accessible to the online rasterizer substantially in the order in which each polygon contributes to the sequence of control data.

20. The lithographic apparatus according to claim 18, wherein the non-overlapping polygons are trapezoids.

21. The lithographic apparatus according to claim 1, wherein the storage device is accessible by the online rasterizer and configured to store at least the portion of the intermediate representation of the requested dose pattern relevant to the portion of the pattern being rasterized at any given time.

22. The lithographic apparatus according to claim 5, further comprising:

an online pre-processing device configured to remove all remaining levels of hierarchy in the intermediate representation and pass the resulting flattened intermediate representation to the online rasterizer.

23. The lithographic apparatus according to claim 1, wherein the intermediate representation comprises a quadtree representation of the requested dose pattern.

24. The lithographic apparatus according to claim 23, further comprising a plurality of the arrays of individually controllable elements, wherein the intermediate representation comprises a multi-quadtree representation in which the root node for each tree substantially corresponds to a region of the substrate exposed by one of the plurality of arrays of individually controllable elements at a particular time.

25. A device manufacturing method, comprising:

modulating a beam of radiation using an array of individually controllable elements;

converting a first representation of a requested dose pattern to a sequence of control data suitable for controlling the array of individually controllable elements in order substantially to form the requested dose pattern on a substrate; converting the first representation of the requested dose pattern offline to an intermediate representation that is rasterized in a fewer number of operations than the first representation;

storing the intermediate representation in a storage device; and accessing the stored intermediate representation and producing therefrom a stream of bitmap data to be used to generate the sequence of control data substantially in real time.

26. The device manufacturing method according to claim 25, wherein:

the bitmap data is composed of a sequence of lines of bitmap values, ordered substantially according to an exposure sequence of portions of the requested pattern defined by the lines; and a plurality of modification rules define how the bitmap values change from line to line in the sequence of lines, the plurality of modification rules comprising, deriving each one of at least a subset of the modification rules from a corresponding portion of the requested dose pattern represented by a vector and applying each such modification rule for all lines affected by the corresponding vector; and producing an intermediate representation comprising a sequence of data packets, each describing how a group of modification rules relevant for a given line is different from a group of modification rules relevant for a preceding line.

27. The device manufacturing method according to claim 26, wherein the bitmap data uses a 1-dimensional run-length encoding to represent each the line of bitmap values and the modification rules define how the 1-dimensional run-length encoding of each line of bitmap values changes from line to line in the sequence of lines.

28. The device manufacturing method according to claim 25, wherein:

the bitmap data is composed of a sequence of lines of bitmap values, ordered substantially according to an exposure sequence of portions of the requested pattern defined by the lines; and a plurality of modification rules define how the bitmap values change from line to line in the sequence of lines, the plurality of modification rules comprising, deriving each one of at least a subset of the modification rules from a corresponding portion of the requested dose pattern represented by a curved section with constant properties and applying each such modification rule for all lines affected by that curved section; and producing an intermediate representation comprising a sequence of data packets, each describing how a group of modification rules relevant for a given line is different from a group of modification rules relevant for a preceding line.

29. The device manufacturing method according to claim 28, wherein the bitmap data uses a 1-dimensional run-length encoding to represent each the line of bitmap values and the modification rules define how the 1-dimensional run-length encoding of each line of bitmap values changes from line to line in the sequence of lines.

30. A flat-panel display manufactured according to the method of claim 25.

31. An integrated circuit device manufactured according to the method of claim 25.

32. A computer readable medium having a computer program for controlling a lithographic apparatus having a computer program logic recorded thereon for controlling at least one processor, the computer program logic comprising:

computer program code means for modulating a beam of radiation using an array of individually controllable elements;

computer program code means for converting a first representation of a requested dose pattern to a sequence of control data suitable for controlling the array of individually controllable elements in order substantially to form the requested dose pattern on a substrate;

computer program code means for converting the first representation of the requested dose pattern offline to an intermediate representation that is rasterized in a fewer number of operations than the first representation;

computer program code means for storing the intermediate representation in a storage device; and computer program code means for accessing the stored intermediate representation and producing therefrom a stream of bitmap data to be used to generate the sequence of control data substantially in real time.

* * * * *